(12) United States Patent
Sakurai et al.

(10) Patent No.: US 7,851,866 B2
(45) Date of Patent: Dec. 14, 2010

(54) ELECTRIC POWER CONVERSION DEVICE

(75) Inventors: Naoki Sakurai, Hitachi (JP); Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 631 days.

(21) Appl. No.: 11/338,668

(22) Filed: Jan. 25, 2006

(65) Prior Publication Data

US 2006/0215341 A1 Sep. 28, 2006

(30) Foreign Application Priority Data

Mar. 24, 2005 (JP) ............................. 2005-085176

(51) Int. Cl.
  *H01L 23/58* (2006.01)
(52) U.S. Cl. ........................ 257/368; 257/48
(58) Field of Classification Search ................. 327/512; 257/48, 368
See application file for complete search history.

(56) References Cited

U.S. PATENT DOCUMENTS

| | | | | |
|---|---|---|---|---|
| 5,775,310 A | * | 7/1998 | Ito et al. ..................... | 123/644 |
| 6,180,966 B1 | * | 1/2001 | Kohno et al. ................ | 257/173 |
| 6,188,109 B1 | * | 2/2001 | Takahashi ................... | 257/355 |
| 6,215,634 B1 | | 4/2001 | Terasawa | |
| 6,552,919 B1 | * | 4/2003 | Bors ........................... | 363/42 |
| 7,279,954 B2 | * | 10/2007 | Throngnumchai et al. .. | 327/512 |
| 2003/0072117 A1 | * | 4/2003 | Maekawa et al. ........... | 361/86 |
| 2005/0099751 A1 | * | 5/2005 | Kumagai .................... | 361/100 |

FOREIGN PATENT DOCUMENTS

| | | |
|---|---|---|
| DE | 198 24 064 A1 | 12/1999 |
| DE | 100 31 778 A1 | 1/2002 |
| DE | 101 47 838 A1 | 4/2003 |
| DE | 10 2004 006 753 A1 | 1/2005 |
| JP | 7169952 * | 7/1995 |
| JP | 10-032476 | 2/1998 |

OTHER PUBLICATIONS

Iwamuro, Noriyuki: A New Vertical IGBT Structure with a Monolithic Over-Current, Over-Voltage, and Over-Temperature Sensing and Protecting Circuit. IEEE Electron Device Letters, vol. 16, No. 9, Sep. 1995, pp. 399-401. [online].

Tietze, U: Halbleiter-Schaltungstechnik [Semiconductor Circuit Technology]. Springer, 1993. pp. 785-786, 886-887.

* cited by examiner

*Primary Examiner*—Wai-Sing Louie
*Assistant Examiner*—Bilkis Jahan
(74) *Attorney, Agent, or Firm*—Antonelli, Terry, Stout & Kraus, LLP.

(57) ABSTRACT

An object of the present invention is to provide an electric power converter including means for accurately detecting a principal current of IGBT. An electric power conversion device according to the present invention includes principal current estimation means for estimating a principal current by using: an output of temperature measuring means whose diode is disposed in the same semiconductor substrate as an IGBT including an emitter having flowing therethrough the principal current and a sense emitter having flowing therethrough a sense current proportional to the principal current; the sense current; and the information, preliminarily stored in memory means, on the relationship among the semiconductor substrate temperature, the principal current and the sense currant.

5 Claims, 10 Drawing Sheets

TURN OFF CHARACTERISTICS

ELECTRIC POWER CONVERSION DEVICE

The present application is based on and claims priority of Japanese patent application No. 2005-085176 filed on Mar. 24, 2005, the entire contents of which are hereby incorporated by reference.

BACKGROUND OF THE INVENTION

1. Field of the Invention

The present invention relates to an electric power conversion device including an IGBT, and more particularly to an electric power conversion device including a current conversion device requiring highly accurate current measurement.

2. Description of the Related Art

As a next-generation car comprised of a combination of an engine and a motor, hybrid automobiles are attracting attention. As the motor for use in hybrid automobiles, there has been employed a synchronous motor being small in size and capable of generating a high torque, and having embedded therein a permanent magnet. To extract the torque of the synchronous motor to a maximum extent, vector control is generally used. FIG. 8 is an exemplary control block diagram of such vector control. Current commands are calculated according to speed ω and torque command τr generated by accelerator or brake command. Based on three-phase output current and magnetic pole position θ detected by a magnetic pole position detector 18, the three-phase current is coordinate-converted to d-q coordinates to produce iq and id. Current control signals Vqr and Vdr are generated according to iq and id and current commands idr and iqr. Further, re-conversion from d-q coordinates to three phases is performed, and a driver IC 50 generates a PWM signal and drives an insulated gate bipolar transistor (hereinafter referred to as an IGBT) 19 of an inverter. At this time, dead-time error compensation is performed on the signal which has been subjected to the re-conversion from d-q coordinates to three phases.

For such vector control, a current sensor 17 for measuring an output current of the inverter is essential. In such current sensor, there are provided a core (not shown), a hall element and an amplifier; a gap is provided in part of the core disposed around the current bus, and the magnetic field generated by the current to be detected is detected by the hall element disposed within the gap and converted to a voltage.

In Japanese Patent Publication No. 10-32476 (descriptions in FIGS. 1 to 4), there is described a technique in which as current detecting means not using a current sensor, a sense section is provided separately from a section having flowing therethrough the principal current of an IGBT 19 or power MOSFET, whereby the current is detected.

FIG. 9 shows an exemplary cross sectional structure of an IGBT having a sense section. A plurality of p layers 103A and n+ layers 104A which are sections having flowing therethrough the principal current, are connected by a principal emitter electrode 120. The sections (p layers 103B and n+ layers 104B) having flowing therethrough a sense current are connected to a sense emitter electrode 121. Though not shown, gate electrodes 111A and 111B are all connected. The current flowing through the IGBT is proportional to the width (gate width) of n+ layers 104A and 104B. Accordingly, when a current (sense current) of the sense section is measured, a principal current can be measured based on the ratio between the gate width of n+ layer 104B of the sense section and that of n+ layer 104A of the principal emitter.

FIG. 10 shows an exemplary circuit for measuring a principal current according to the sense current. A voltage generated in a resistor Rs by sense current Is is measured by a voltage detector 16, and principal current Im is measured by multiplying sense current Is by the gate width ratio of n+ layer 104A of the principal emitter. In the present circuit, when the voltage detected by the voltage detector is a set voltage or more, it is determined that an excess current status occurs, thus cutting off the IGBT.

In the above described technique using a current sensor, the current sensor, composed of plural components, is costly. Furthermore, a magnetic core is used in the current sensor, so the magnetic force is lost at high temperature, and thus the current sensor cannot be used at high temperature.

FIG. 11 shows output characteristics of IGBT and power MOSFET. In power MOSFET, current is proportional to voltage ranging from 0 V. In contrast, in IGBT, current hardly flows when voltage is low, and current sharply increases at a certain voltage value or more. Also, in power MOSFET, current decreases in inverse proportion to temperature. In contrast, in IGBT, the voltage value at which current begins to rise, lowers as temperature rises, but once current rises, the slope of current relative to voltage becomes smaller. In this way, the voltage-current characteristics of IGBT are non-linear and vary in a nonlinear manner relative to temperature, so it is difficult to accurately measure a principal current according to the sense current.

Accordingly, an object of the present invention is to provide an electric power converter including means for detecting a principal current of IGBT with high accuracy.

SUMMARY OF THE INVENTION

An electric power conversion device according to the present invention comprises principal current estimation means for receiving a sense current and an output of temperature measuring means which is disposed in the same semiconductor substrate as an IGBT including an emitter having flowing therethrough a principal current and a sense emitter having flowing therethrough a sense current proportional to the principal current, and thereby estimating the principal current.

With the electric power conversion device according to the present invention, a current flowing through the principal emitter can be accurately measured.

DETAILED DESCRIPTION OF THE PREFERRED EMBODIMENTS

The present invention will be described below in detail with reference to the drawings.

Embodiment 1

Figure 1:
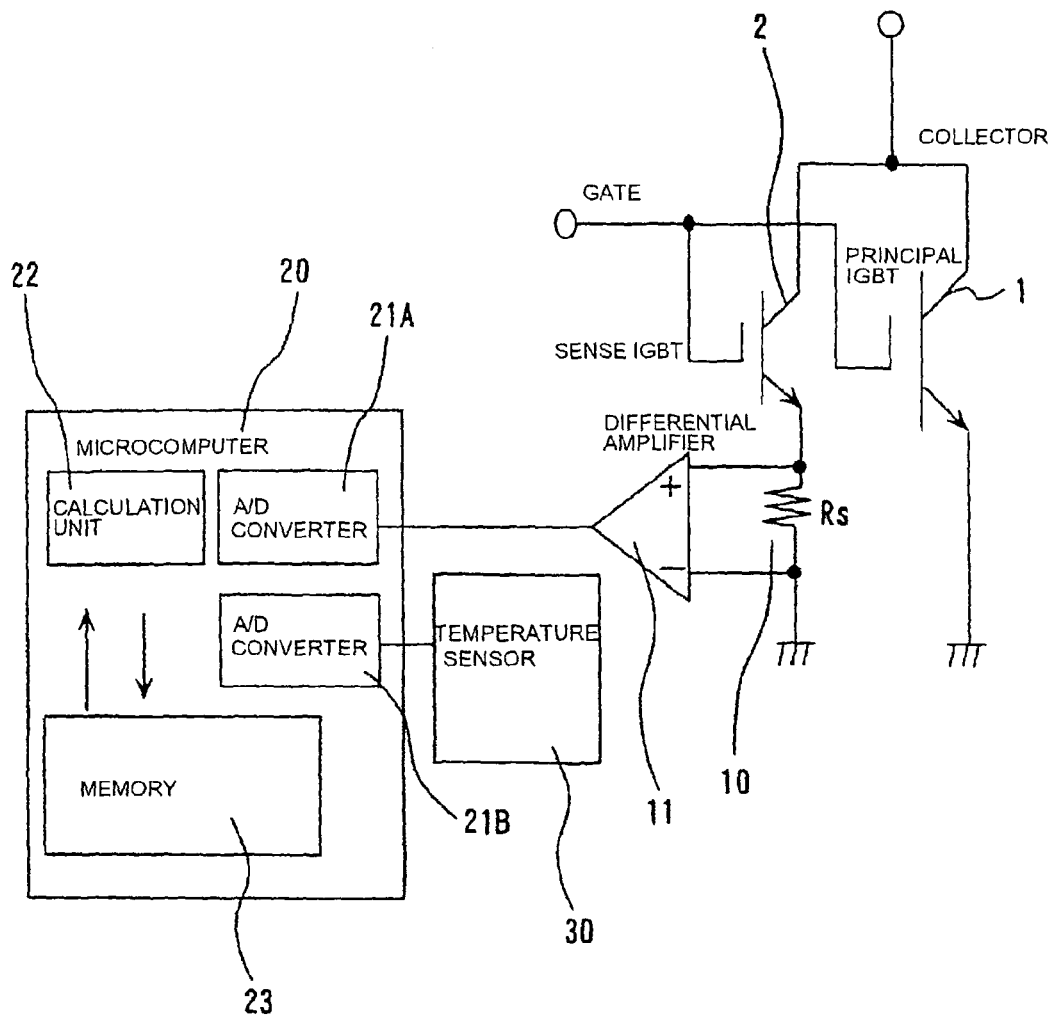
FIG. 1 is an explanatory view of a current detection circuit according to Embodiment 1.

The present embodiment is shown in FIG. 1. In FIG. 1, there is shown one IGBT from among six IGBTs constituting an inverter outputting a three-phase frequency-variable alternating current, and there are omitted a gate drive circuit section of the IGBT, and a control section outputting a PWM signal to the gate drive circuit section; these sections constitute the electric power conversion device. The IGBT according to the present embodiment comprises a principal IGBT1 controlling the principal current of the electric power conversion device and a sense IGBT2 having a smaller gate width than that of the principal IGBT1. The gate being the control terminal of the principal IGBT1 and the sense IGBT2 is shared, and the collector being the principal terminal of one of the IGBTs is shared. A resistor 10 is connected to the sense IGBT2; one end thereof has the same potential as the emitter of the principal IGBT, and is connected to the ground in the example of FIG. 1. A differential amplifier 11 is connected to both ends of the resistor 10. The output of the differential amplifier 11 is supplied to an A/D converter 21A of a microcomputer 20. The microcomputer 20 includes a calculation unit 22 and a memory 23. The memory 23 of the microcomputer 20 has stored therein the temperature dependence of the ratio between the current flowing through the principal IGBT1 and that flowing through the sense IGBT2. Further, IGBT temperature information is transmitted from a temperature sensor 30 to the microcomputer 20 via an A/D converter 21B.

The operation of the present embodiment will now be described. A current proportional to the current of the principal IGBT1 flows through the sense IGBT2, and further this current is converted to a voltage by the resistor 10. When the voltage of the resistor 10 is large, an error occurs in the ON voltage of the principal IGBT1 and sense IGBT2, causing the gate width and the current ratio of the principal IGBT1 and sense IGBT2 to collapse. Hence, the voltage generated in both ends of the resistor 10 is desirably substantially smaller than the ON voltage of the IGBT; specifically, it is desirably 0.2 V or less. Such small voltage is too low to be converted by the A/D converter 21A, so the differential amplifier 11 amplifies it to a voltage readable by the A/D converter 21A. According to the sense current information from the A/D converter 21A and the temperature information from the A/D converter 21B, the microcomputer 20 estimates a principal current from a data table or a conversion formula of the temperature dependence of the ratio between the current flowing through the sense IGBT2 and that flowing through the principal IGBT1, which is stored on the memory previously. In such a manner, according to the present embodiment, a principal current can be measured with high accuracy without using a current sensor 17.

Figure 2:
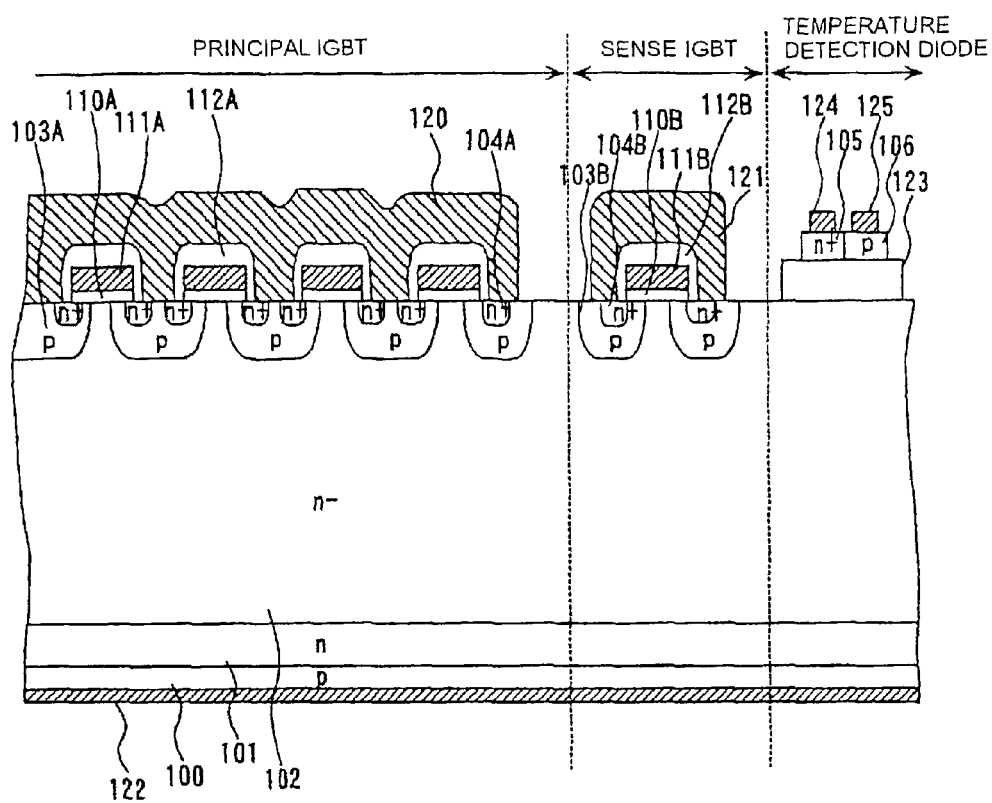
FIG. 2 is a cross-sectional explanatory view of an IGBT having a temperature sensor and a current sense region according to Embodiment 1.

FIG. 2 shows an exemplary cross-sectional view of a preferable temperature sensor according to the present embodiment. A description will be given below in which a silicon substrate is used as the semiconductor substrate. However, semiconductor substrates of other kinds may be used. On p layer 100, there is formed n layer 101. Within n− layer 102, there are formed a plurality of p layers 103A. Within p layer 103A, there is formed n+ layer 104A. Gate oxide film 110A is formed across p layer 103A, n+ layer 104A and n− layer 102. Further, gate electrode 111A is formed on gate oxide film 110A. Principal emitter electrode 120 is formed in an ohmic contact with a plurality of p layers 103A and n+ layers 104A.

Principal emitter electrode 120 and gate oxide film 110A are insulated and separated from each other by insulating film 112A. Collector electrode 122 is in an ohmic contact with p layer 100. The principal IGBT1 is formed of p layer 103A, n+ layer 104A, n− layer 102, gate oxide film 110A, gate electrode 111A, insulation film 112A and principal emitter electrode 120. Similarly, the sense IGBT2 is formed of p layer 103B, n+ layer 104B, n− layer 102, gate oxide film 110B, gate electrode 111B, insulation film 112B and sense emitter electrode 121.

Further, on insulation film 123, there are formed n+ layer 105 and p layer 106 of polysilicon. Cathode electrode 124 is in an ohmic contact with n+ layer 105. Anode electrode 125 is in an ohmic contact with p layer 106. A diode is formed of n+ layer 105, p layer 106, cathode electrode 124 and anode electrode 125 described above.

According to the present embodiment, a current of a predetermined value is made to flow through the diode to generate a forward direction voltage drop. The temperature detection is performed according to that forward direction voltage drop. More specifically, the forward direction voltage drop of a diode becomes smaller as the temperature decreases; thus the relationship between the forward direction voltage drop and the temperature is preliminarily measured and the result is stored in the memory 23, whereby a temperature is accurately detected. Also, since the temperature detection diode, the principal IGBT1 and the sense IGBT2 are disposed on the same chip, the temperature measurement can be performed with higher accuracy and at a faster pace compared to when the temperature measurement is performed by a separate component such as a thermistor.

Figure 3:
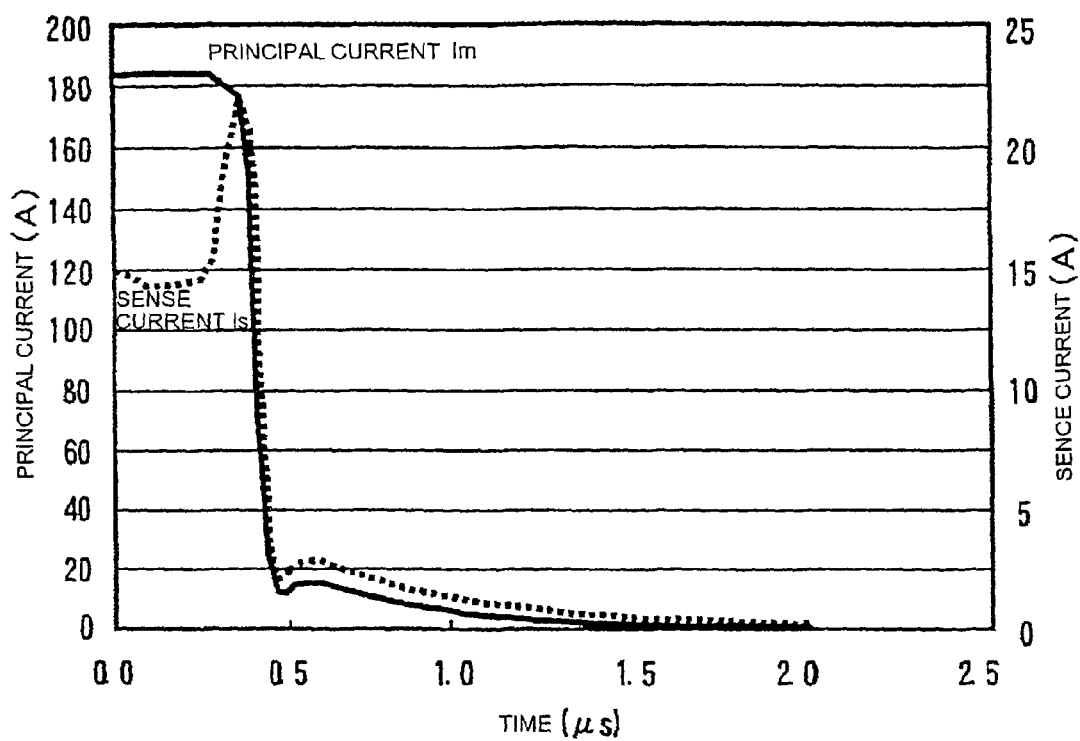
FIG. 3 is an explanatory view of the waveform of the current flowing through a principal IGBT1 and a sense IGBT2 when turned off.

FIG. 3 shows the waveform of the current flowing through the principal IGBT1 and the sense IGBT2 when turned off. Current Is flowing through the sense IGBT2 increases transiently, and then decreases similarly to the principal current of the principal IGBT1.

Figure 4:
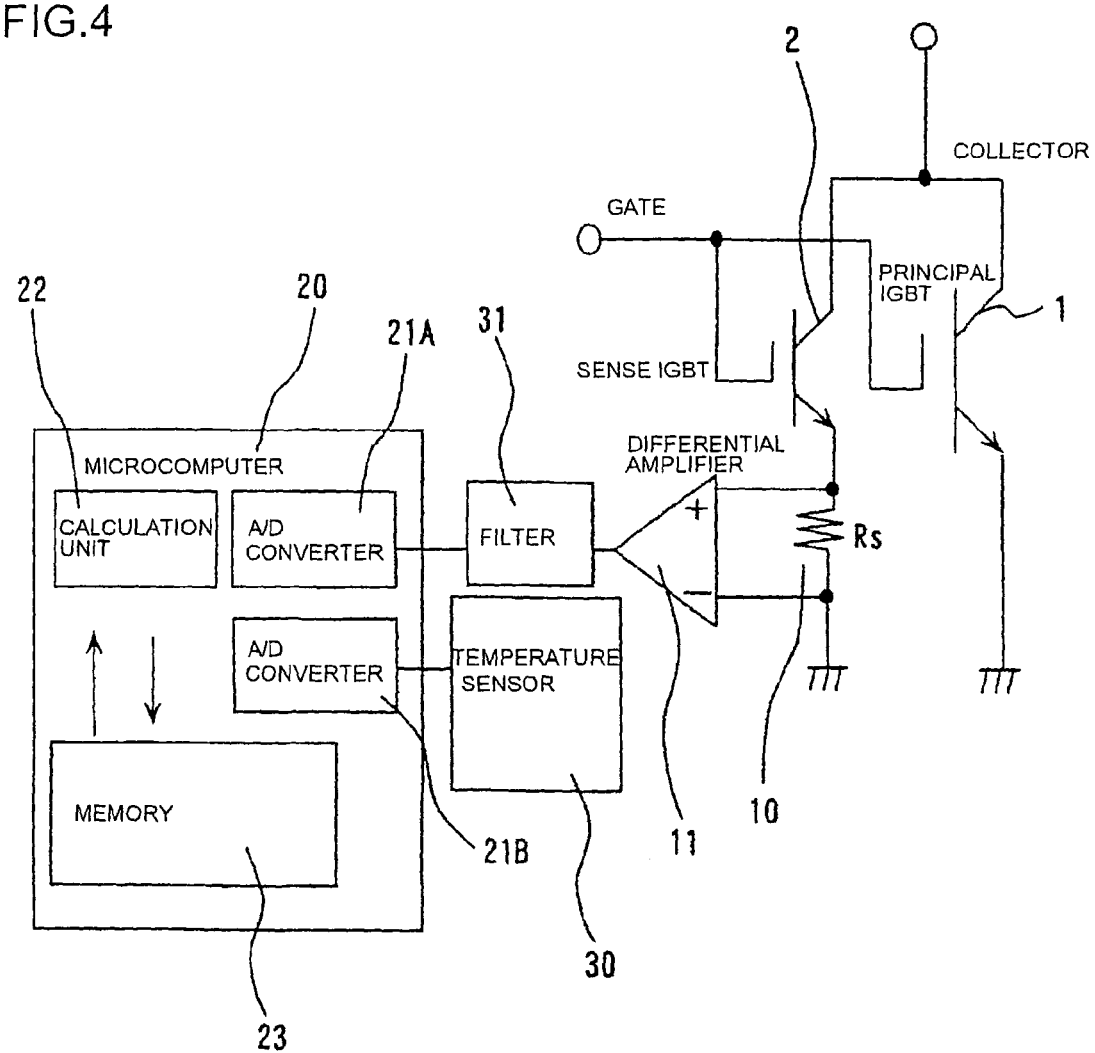
FIG. 4 is an explanatory view of another current detection circuit according to Embodiment 1.

The reason for this will be described with reference to FIG. 2. Power MOSFET is a unipolar device in which an electron or a hole carries the current alone. Electrons are laterally distributed to the same extent as the thickness of n− layer 102. Thus when a comparison between the principal IGBT1 and sense IGBT2 is made with respect to the ratio between the chip area and the number of accumulated holes, it can be seen that the sense IGBT2 accumulates more holes than the principal IGBT1 does. In the steady state, current is proportional to the flow of electrons. Therefore, the current of the principal IGBT1 and that of the sense IGBT2 are proportional to the widths of n+ layers 104A and 104B, respectively. Meanwhile, when turned off, the sense IGBT2 pours out more holes than the principal IGBT1 does, according to the ratio of area therebetween, so a larger current flows transiently through the sense IGBT2. Thus, according to the present embodiment, as shown in FIG. 4, a filter 31 is provided between the output of the differential amplifier 11 and the A/D converter 21A. The filter 31 is a low-pass filter eliminating a rapid-change component, i.e., a high-frequency component from the output signal of the differential amplifier 11. The cut-off frequency of the low-pass filter must be higher than the frequency at which a gate signal for driving the IGBT can pass. Specifically, the cut-off frequency may be higher than the carrier frequency of PWM signal, and is preferably a frequency higher than two times the carrier frequency. The filter 31 may be a passive filter composed of a resistor, a capacitor or a coil, or alternatively an active filter using a discrete element, such as a transistor or an FET, or an IC such as an operational amplifier.

According to the present embodiment, by disposing the filter in this way, the current ratio between the principal IGBT and sense IGBT is prevented from transiently collapsing. As shown in FIG. 4, by virtue of provision of the filter 31, a transient deviance of the current ratio between the principal IGBT and sense IGBT is eliminated, and after the elimination, the information is transmitted to the microcomputer 20, whereby the current measurement can be performed more accurately.

The present embodiment has been described by taking a three-phase inverter as an example of the electric power converter. However, the present invention can also be applied to the principal current detection in a semiconductor power switching device of an electric power converter such as a DC/DC converter or an AC/DC converter.

Embodiment 2

Figure 5:
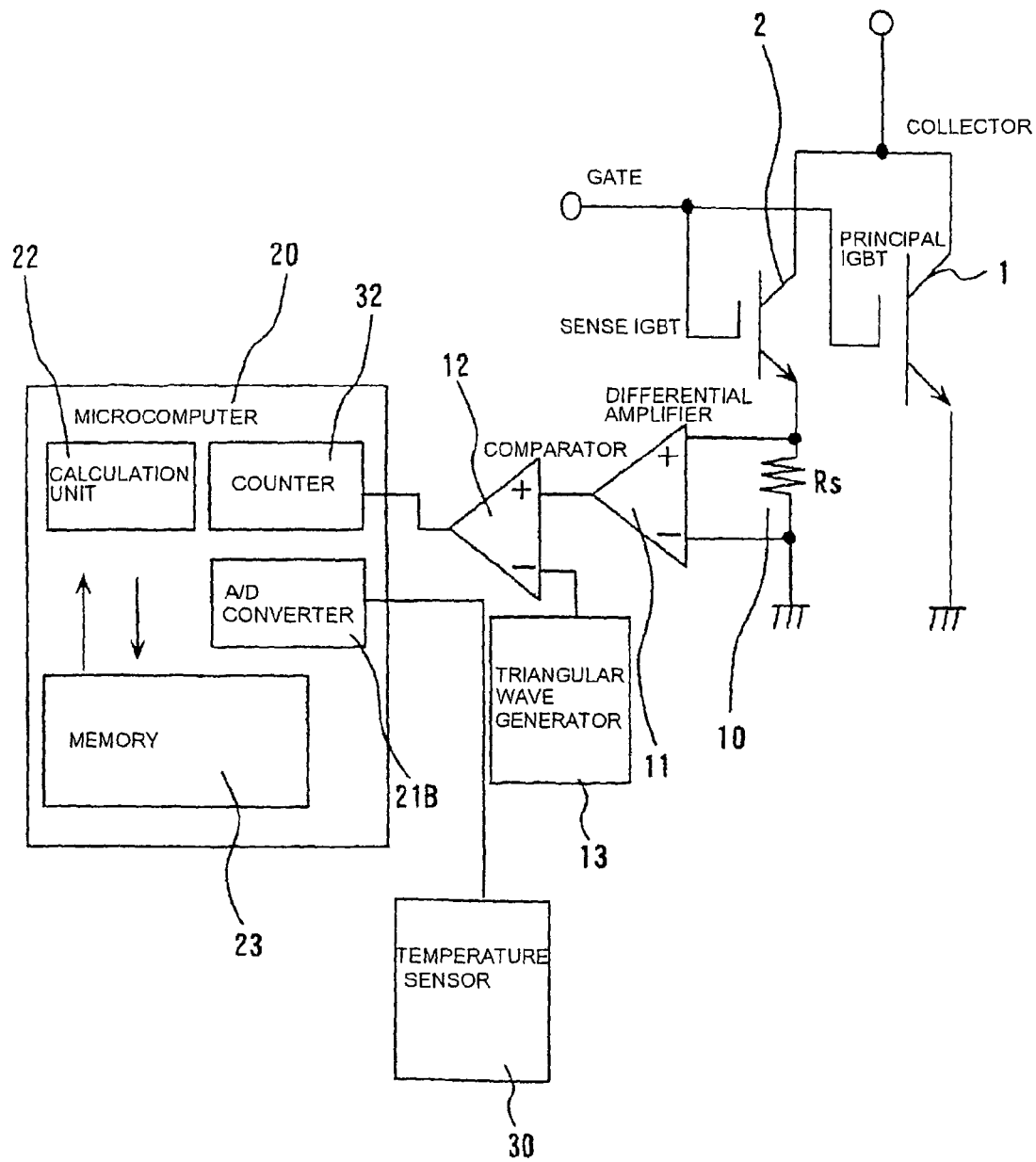
FIG. 5 is an explanatory view of a current detection circuit according to Embodiment 2.

FIG. 5 shows the present embodiment. The difference between the present embodiment and Embodiment 1 is that the output of the differential amplifier 11 is subjected to pulse width modulation and then transmitted to the microcomputer 20. The output of the differential amplifier 11 is supplied to one terminal (the + side) of a comparator 12. A signal from a triangular wave generator 13 is supplied to the other terminal (the − side) of the comparator 12. The output of the comparator 12 is supplied to a counter 32 incorporated into the microcomputer 20. Instead of the counter 32, a timer may receive the output.

The operation according to the present embodiment is as follows. By comparing the output of the differential amplifier 11 with the signal of the triangular wave generator 13, the output of the differential amplifier 11 is converted to a corresponding pulse width. By measuring this pulse width, the counter 32 can measure a voltage of the differential amplifier. By converting the output of the differential amplifier 11 to a pulse width in this way, noise components are averaged by the triangular wave period, so the noise influence is reduced.

In the present embodiment, it is desirable that the relationship between the voltage of the differential amplifier and the ratio of the pulse width to the triangular wave period is preliminarily stored in the memory 23 of the microcomputer 20, whereby the calculation unit 22 restores the pulse width to a voltage.

When the ambient temperature varies, the period and the upper and lower limits of the triangular wave generator 13 vary. Thus the pulse width also varies as the temperature varies. However, the variation in the ratio between the pulse width and the triangular wave period is small, so sufficient accuracy can be secured.

Embodiment 3

Figure 6:
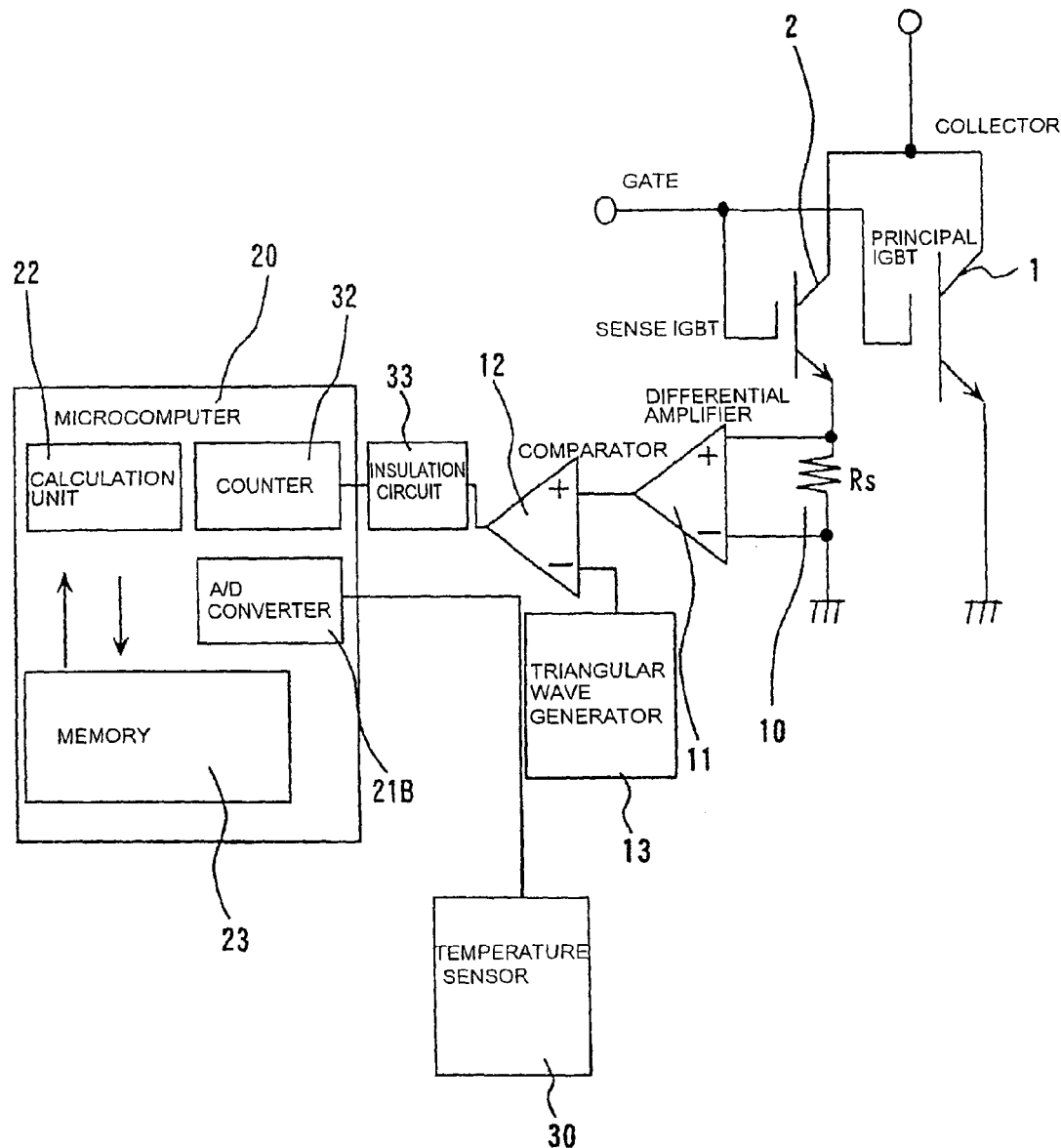
FIG. 6 is an explanatory view of a current detection circuit according to Embodiment 3.

FIG. 6 shows the present embodiment. The difference between the present embodiment and Embodiment 2 is that an insulation circuit 33 being signal insulation transmission means is disposed between the output of the comparator 12 and the counter 32. According to the present embodiment, even when the ground voltage of the IGBT and that of the microcomputer 20 are different from each other, for example, even when the IGBT is disposed in the inverter upper arm, a current can be measured. As the insulation circuit 33, a photocoupler or a pulse transformer is preferable.

In the present embodiment, a photocoupler or a pulse transformer is used as the insulation circuit 33. However, such insulation circuit 33 cannot transmit an analog signal. Thus, according to the present embodiment, similarly to Embodiment 2, a current signal is converted to a signal having a corresponding pulse width; current information from the IGBT is converted to a digital signal. As described above, according to the present embodiment, by using as the insulation circuit 33 a photocoupler or a pulse transformer, current information from the IGBT can be transmitted to the microcomputer 20 having a different ground voltage.

Embodiment 4

Figure 7:
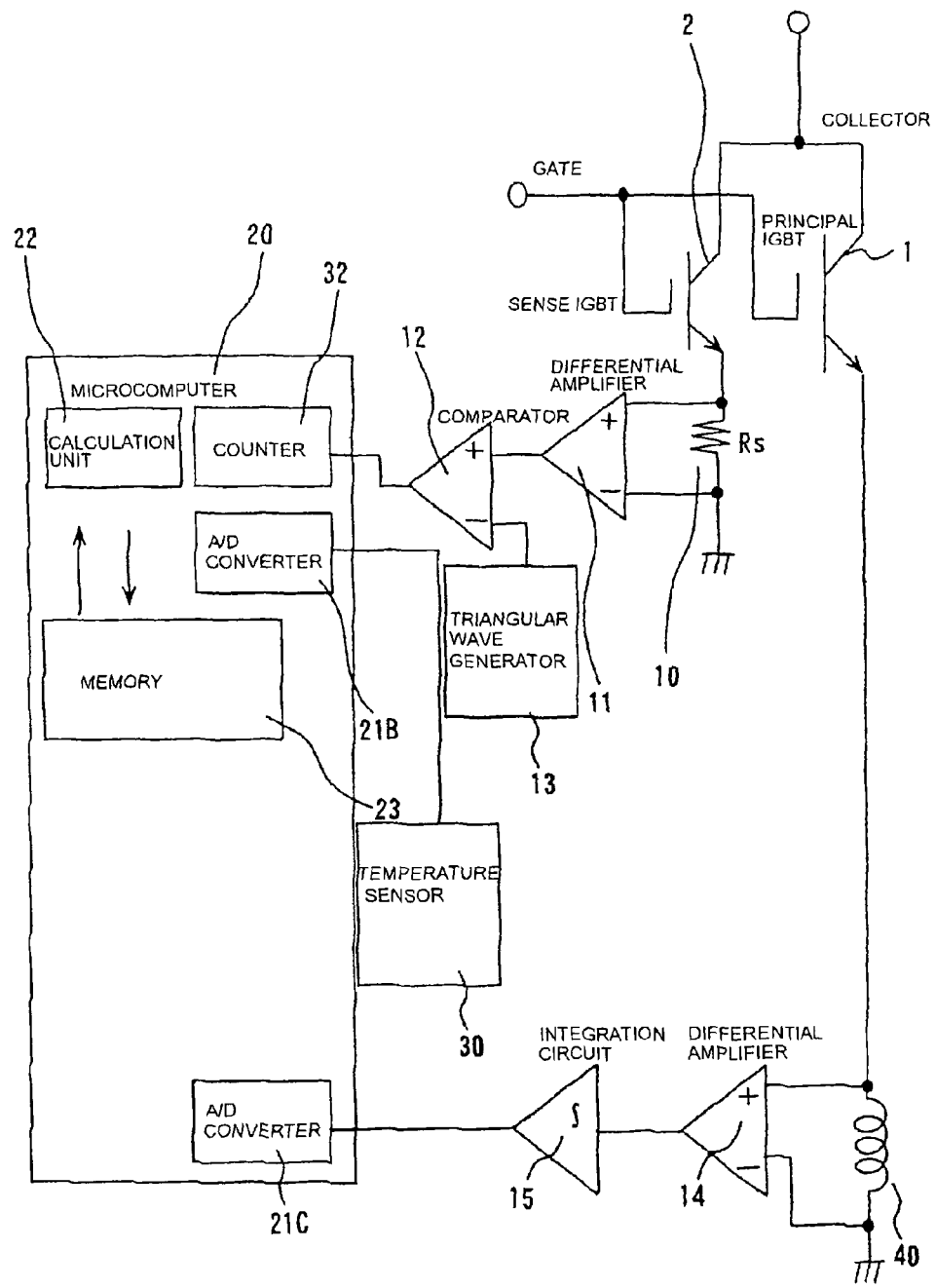
FIG. 7 is an explanatory view of a current detection circuit according to Embodiment 4.
Figure 8:
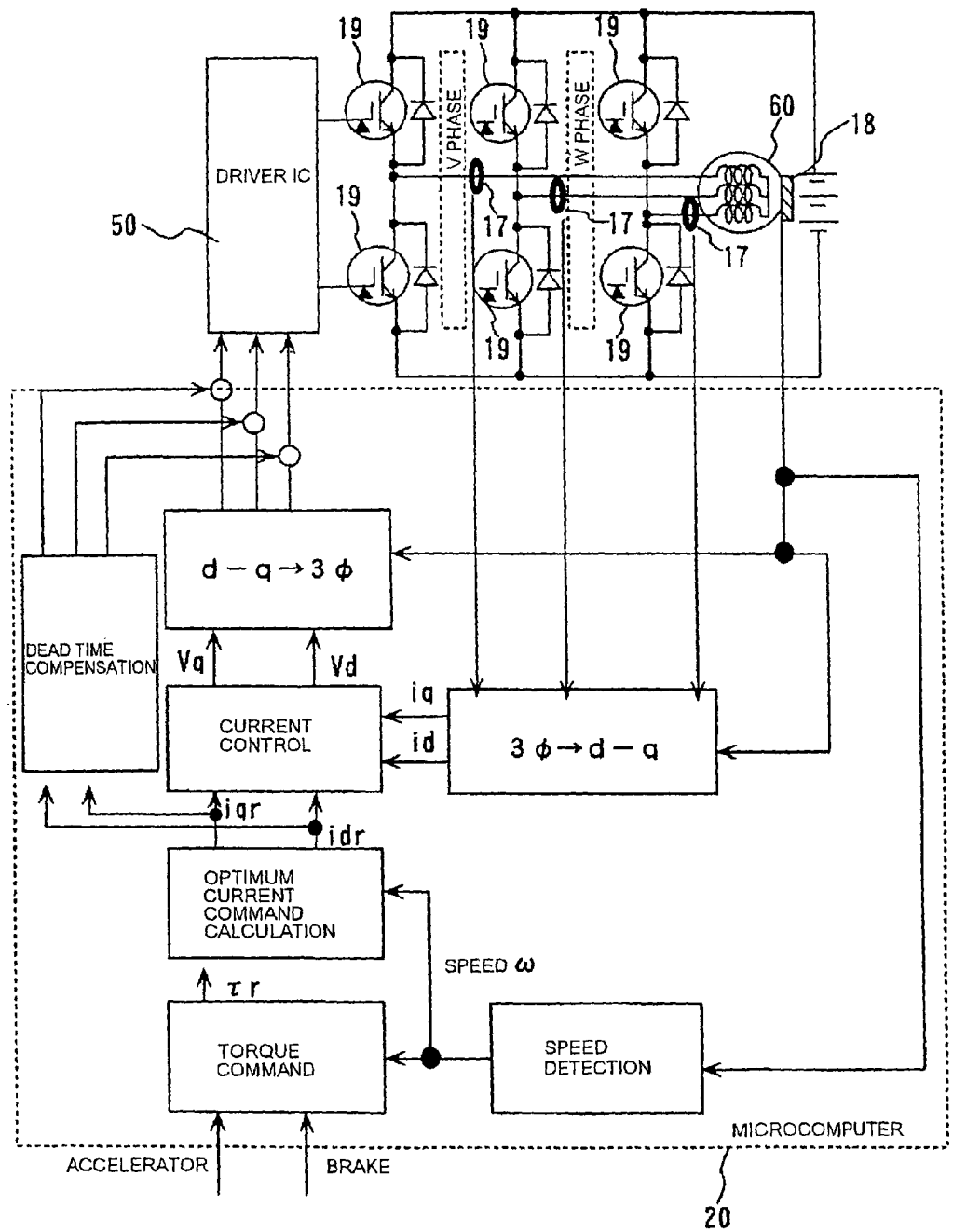
FIG. 8 is an explanatory view of a conventional synchronous motor control block.
Figure 9:
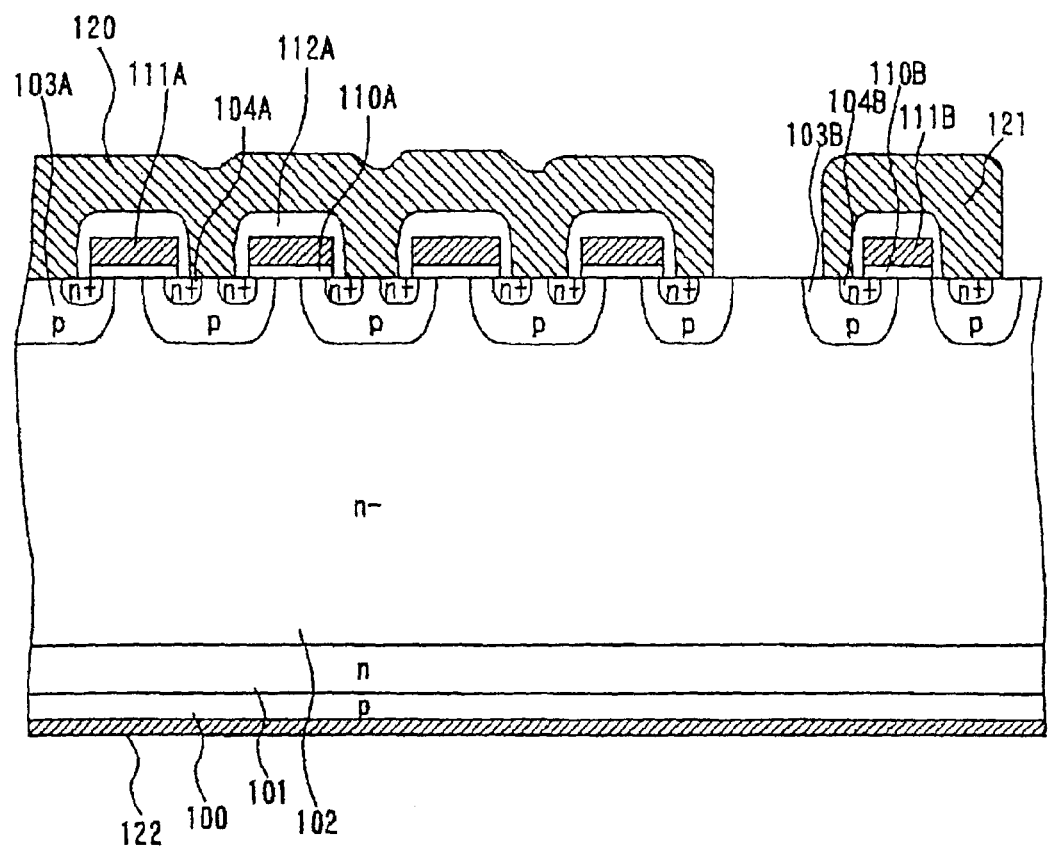
FIG. 9 is a cross-sectional explanatory view of an IGBT having a conventional sense region.
Figure 10:
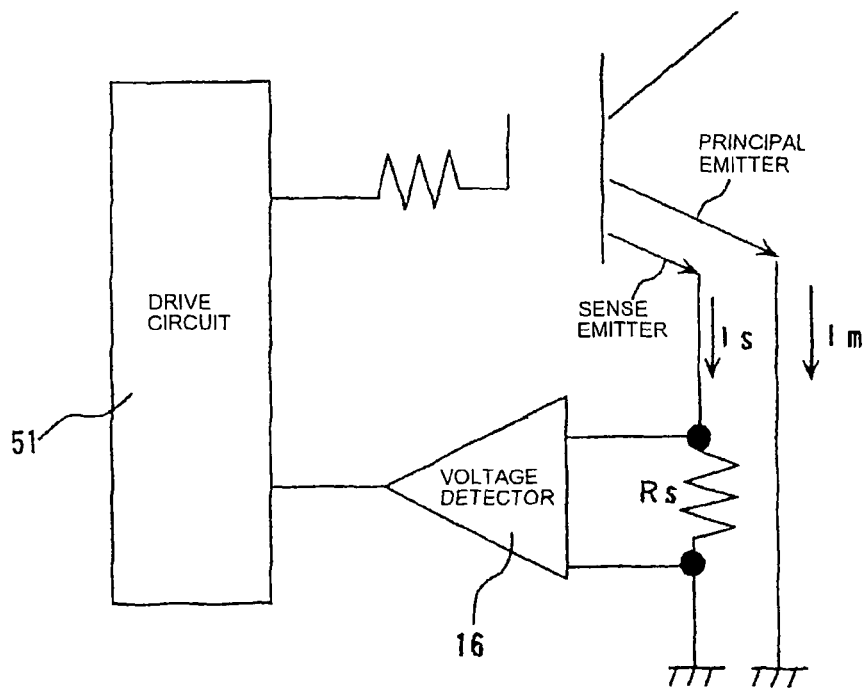
FIG. 10 is an explanatory view of a current detection circuit using a conventional sense IGBT.
Figure 11:
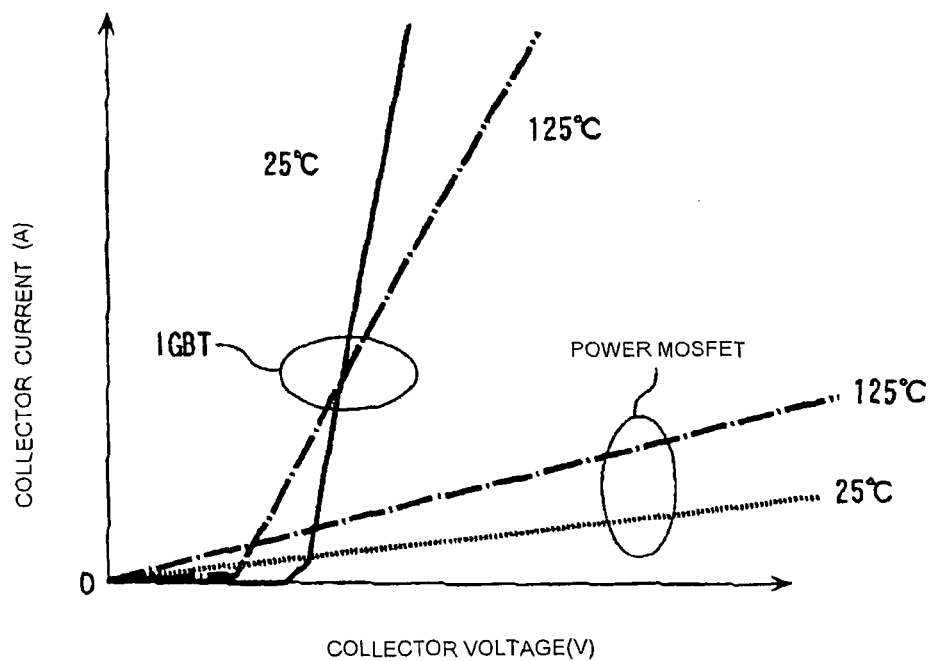
FIG. 11 is an explanatory view of the characteristic of IGBT and power MOSFET.

FIG. 7 shows the present embodiment. The difference between the present embodiment and Embodiment 2 is that there are further provided a differential amplifier 14 amplifying a voltage induced in a wiring inductance 40 of the principal IGBT, an integration circuit 15 integrating the voltage, and an A/D converter 21C incorporated into the microcomputer 20 receiving the integration result.

When the current of inductance L varies dI/dt as time passes, voltage V expressed as formula 1 is generated.

$$V = L \times dI/dt \quad \text{(formula 1)}$$

Then, as shown in formula 2, $$I = \int (V/L) dt \quad \text{(formula 2)}$$

A current is obtained by dividing a voltage induced in the wiring inductance 40 of the principal IGBT by the inductance value and then integrating the resultant value. Due to the integral calculation, the response tends to be delayed. Thus, preferably, the technique of measuring a current flowing through the sense IGBT by use of the method described in Embodiments 1 to 3 is simultaneously used. When the measurement is performed in such a manner, the response is improved and at the same time a dual system for measuring a current is implemented, so reliability is also increased.

What is claimed is:

1. An electric power conversion device comprising:

at least one IGBT, the IGBT including on the same semiconductor substrate thereof a first emitter having flowing therethrough a principal current, a second, sense emitter having a same cross-sectional structure as the first emitter and a smaller gate width than the first emitter, and means for measuring temperature;

means for driving the IGBT; and principal current estimation means for receiving an output of the temperature measuring means and a sense current flowing through the sense emitter, and thereby estimating the principal current, wherein the principal current estimation means includes:

current-voltage conversion means for converting the sense current to a voltage;

first ND conversion means for converting a voltage outputted by the current-voltage conversion means from analog to digital form;

memory means for storing a relationship among a semiconductor substrate temperature of the IGBT, the principal current and the sense current; and calculation means for receiving the relationship information, stored in the memory means, among the semiconductor substrate temperature, the principal current and the sense current, the information on sense current converted by the first A/D conversion means, and the information on temperature of the IGBT, and thereby calculating the principal current, and wherein motor vector control is performed based on the principal current calculated by the calculation means based on the information on the temperature.

2. The electric power conversion device according to claim 1, wherein the temperature measuring means is a diode disposed on one principal surface of the semiconductor substrate via an insulating layer.

3. The electric power conversion device according to claim 1, wherein an output of the current-voltage conversion means of the principal current estimation means is supplied to the first A/D conversion means via filter means.

4. The electric power conversion device according to claim 1, wherein the principal current estimation means includes second A/D conversion means for converting a voltage outputted by the temperature measuring means from analog to digital form.

5. An electric power conversion device comprising:
 at least one IGBT,
 the IGBT including on one principal surface of a semiconductor substrate thereof a collector electrode, and on another surface of the semiconductor substrate a first emitter having flowing therethrough a principal current, a second, sense emitter having a same cross-sectional structure as the first emitter and a smaller gate width than the first emitter, and means for measuring temperature, the temperature measuring means is a diode disposed via an insulating layer on said another principal surface of the semiconductor substrate;

means for driving the IGBT; and principal current estimation means for receiving an output of the temperature measuring means and a current flowing through the sense emitter, and thereby estimating the principal current, wherein the principal current estimation means includes:

current-voltage conversion means for converting the sense current to a voltage;

first A/D conversion means for converting a voltage outputted by the current-voltage conversion means from analog to digital form;

memory means for storing a relationship among a semiconductor substrate temperature of the IGBT, the principal current and the sense current; and calculation means for receiving the relationship information, stored in the memory means, among the semiconductor substrate temperature, the principal current and the sense current, the information on sense current converted by the first A/D conversion means, and the information on temperature of the IGBT, and thereby calculating the principal current, and wherein motor vector control is performed based on the principal current calculated by the calculation means based on the information on the temperature.

* * * * *